United States Patent [19]
Chen et al.

[11] Patent Number: 5,724,005
[45] Date of Patent: Mar. 3, 1998

[54] LINEAR POWER AMPLIFIER WITH AUTOMATIC GATE/BASE BIAS CONTROL FOR OPTIMUM EFFICIENCY

[75] Inventors: Young-Kai Chen, Berkeley Heights; Jenshan Lin, Flanders, both of N.J.

[73] Assignee: Lucent Technologies Inc., Murray Hills, N.J.

[21] Appl. No.: 637,999

[22] Filed: Apr. 25, 1996

[51] Int. Cl.[6] .................................................. H03G 3/30
[52] U.S. Cl. .................... 330/279; 330/285; 455/126; 455/127
[58] Field of Search .................................. 330/129, 136, 330/279, 285, 296; 455/126, 127

[56] References Cited

U.S. PATENT DOCUMENTS

| | | | |
|---|---|---|---|
| 4,462,004 | 7/1984 | Cox et al. | 330/296 X |
| 5,029,298 | 7/1991 | Chiba et al. | 330/285 |
| 5,363,058 | 11/1994 | Sasaki | 330/279 X |
| 5,532,646 | 7/1996 | Aihara | 330/296 X |
| 5,589,796 | 12/1996 | Alberth, Jr. et al. | 330/285 X |

Primary Examiner—James B. Mullins

[57] ABSTRACT

A dynamic power amplifier advantageously employed in a wireless terminal for transferring and receiving signals from a base terminal includes an input amplifier adapted to receive an input signal having a given power signal level corresponding to the distance of said wireless terminal to the terminal and adapted to provide an amplifier output signal having a given power output signal level. The dynamic amplifier further includes a power sensor configured to receive the power output signal and to generate a power indication signal corresponding to the power output signal, and a converter adapted to receive the power indication signal in order to generate a biasing signal corresponding to the power indication signal. The biasing signal is applied to the input amplifier so that the operating bias point of the power amplifier varies as a function of the power indication signal.

11 Claims, 4 Drawing Sheets

LINEAR POWER AMPLIFIER WITH AUTOMATIC GATE/BASE BIAS CONTROL FOR OPTIMUM EFFICIENCY

FIELD OF THE INVENTION

This invention relates to power amplifiers and more specifically to linear power amplifiers operating at high frequencies.

BACKGROUND OF THE INVENTION

A variety of battery-operated electronic circuits employ power amplifiers. For example, wireless terminals such as mobile phones, personal pagers and the like, transmit radio frequency signals that are desired to be amplified by a linear power amplifier. Typically, these terminals operate by batteries that require recharging at certain time intervals. It is desirable to increase the efficiency of these terminals so that they can be used for a longer period of time without the need to recharge their batteries.

At least one disadvantage with the current wireless terminals is that they do not operate at a substantially efficient manner. The power amplifier employed in the presently available wireless terminals receives a substantially high input power signal and provides a substantially high output power signal when the terminal is far from a corresponding receiver station, such as a base terminal in a cellular wireless communications system. Typically, the operating power of the power amplifier remains fixed, based on the biasing voltage signals of the amplifier. When operating in response to high input power signals, the power amplifier exhibits a substantially high efficiency. However, when the wireless terminal is closer to the base station the required operating power of the power amplifier is not substantially high. Nevertheless, since the operating power of the power amplifier is fixed, the efficiency of the amplifier decreases substantially. This leads to shorter battery life and thus more recharging intervals.

Thus, there is a need for a power amplifier which operates at substantially high efficiency, for example, power added efficiency, as defined below, through a broad range of output power levels.

SUMMARY OF THE INVENTION

Briefly, in accordance with one embodiment of the invention, a dynamic power amplifier comprises: an input amplifier adapted to receive an input signal having a given power signal level and adapted to provide an amplifier output signal having a given power output signal level; a power sensor configured to receive the power output signal and to generate a power indication signal corresponding to the power output signal; a converter adapted to receive the power indication signal in order to generate a biasing signal corresponding to the power indication signal, the biasing signal applied to the input amplifier so that the operating bias point of the power amplifier varies as a function of the power indication signal.

Briefly, in accordance with another embodiment of the invention, a dynamic power amplifier comprises: an input amplifier adapted to receive an input signal having a given power signal level and adapted to provide an amplifier output signal having a given power output signal level; a power sensor configured to receive at least one of the input power or output power signals, the power sensor further adapted to generate a power indication signal corresponding to at least one of the input power or output power signals; a converter adapted to receive the power indication signal so as to generate a biasing signal corresponding to the power indication signal, the biasing signal applied to the input amplifier so that the operating bias point of the power amplifier varies as a function of the power indication signal.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE INVENTION

Figure 1:
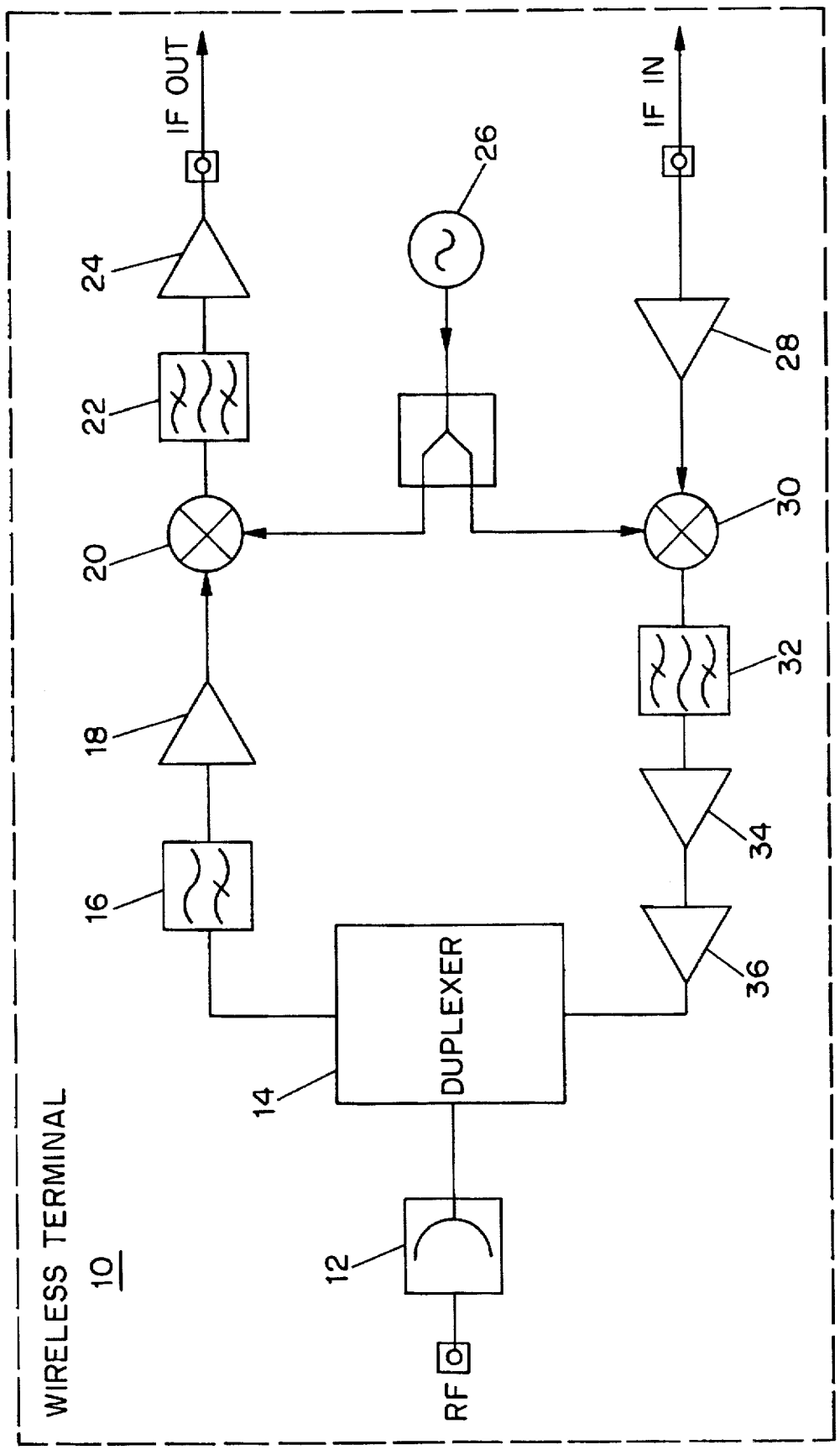
FIG. 1 illustrates a block diagram of the front end of a wireless terminal that employs a dynamic power amplifier in accordance with one embodiment of the invention.

FIG. 1 illustrates a block diagram of the front end of a typical wireless terminal 10 employed in cellular communications system that incorporates a power amplifier 36 in accordance with one embodiment of the present invention, although the invention is not limited in scope in that respect. For example, FIG. 5 illustrates a communications system comprising a base terminal 8 and a plurality of wireless terminals 10, which advantageously employ a power amplifier 36 in accordance with one embodiment of the invention.

Figure 5:
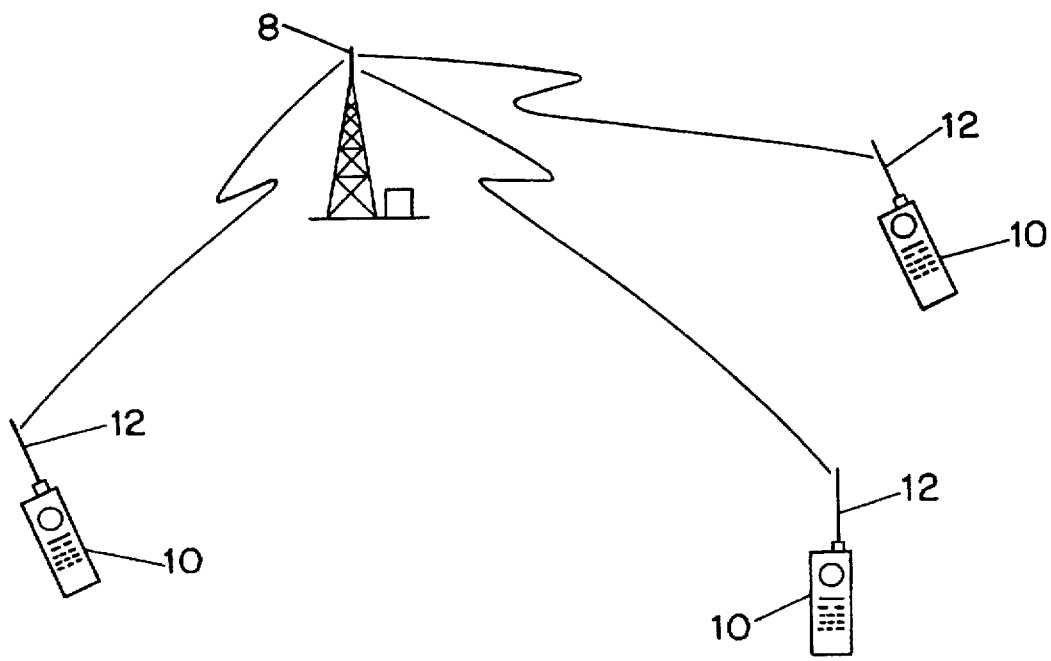
FIG. 5 illustrates a communications system comprising a base station and a receiver employing a dynamic power amplifier in accordance with one embodiment of the invention.

With reference to FIGS. 1 and 5, antenna 12 is configured to receive signals from a base station 8, and to transmit signals from the wireless terminal back to the base station. The output terminal of antenna 12 is coupled to an input terminal of a duplexer 14. Duplexer 14 is designed to route incoming signals from the base station to the upper signal path of wireless terminal 10, and to route signals from the lower path of the wireless terminal to antenna 12.

Signals received by antenna 12 are routed through duplexer 14 to an input terminal of a bandpass filter 16, which is tuned to a desired frequency band intended for the wireless terminal. The output signal of bandpass filter 16 is amplified by low noise amplifier 18, which has an input terminal coupled to the output terminal of the bandpass filter. A mixer 20 receives the output signal of low noise amplifier 18 and a constant frequency signal from voltage-controlled oscillator 26. Mixer 20 down-converts the frequency of the signal received from low noise amplifier 18, and provides the down-converted signal to a bandpass filter 22. The output signal of bandpass filter 22 is then applied to an automatic gain control amplifier 24. The output signal of automatic gain control amplifier 24 is then provided to a signal processing circuit (not shown) for converting the received signal into speech and/or data.

The lower signal path of wireless terminal 10 performs substantially the reverse functions of components described above. Thus, amplifier 28 receives and amplifies the signal intended to be transmitted to a base station. The output signal of amplifier 28 is then applied to a mixer 30, which also receives a constant frequency signal from voltage-controlled oscillator 26. Mixer 30 up-converts the signals received from amplifier 28 to a radio frequency RF signal. The output signal of mixer 30 is coupled to an input terminal of a bandpass filter 32. The output signal of bandpass 32, in turn, is provided to a driver 34, which generates a radio frequency RF signal having a given power signal level.

The output signal of driver 34 is coupled to an input terminal of a dynamic power amplifier such as amplifier 36 in accordance with one embodiment of the present invention. Finally, the output signal of dynamic power amplifier 36 is coupled to antenna 32 via duplexer 14.

As mentioned before, the input power signal level coupled to amplifier 36 depends on the distance of the wireless terminal from the base station. As the distance from the wireless terminal to the base station increases, the required input power signal coupled to amplifier 36 increases also. Conversely, as the distance from the wireless terminal to the base station decreases, the required input power signal coupled to amplifier 36 decreases also. However, with prior an power amplifiers, as the input power signal decreases the efficiency of the amplifier would substantially decrease also. As it will be explained in more detail hereinafter, in accordance with one aspect of the present invention, dynamic power amplifier 36 adjusts its biasing signals so that the amplifier operates at a substantially high efficiency region for a substantially wide range of input power signal levels.

Figure 2:
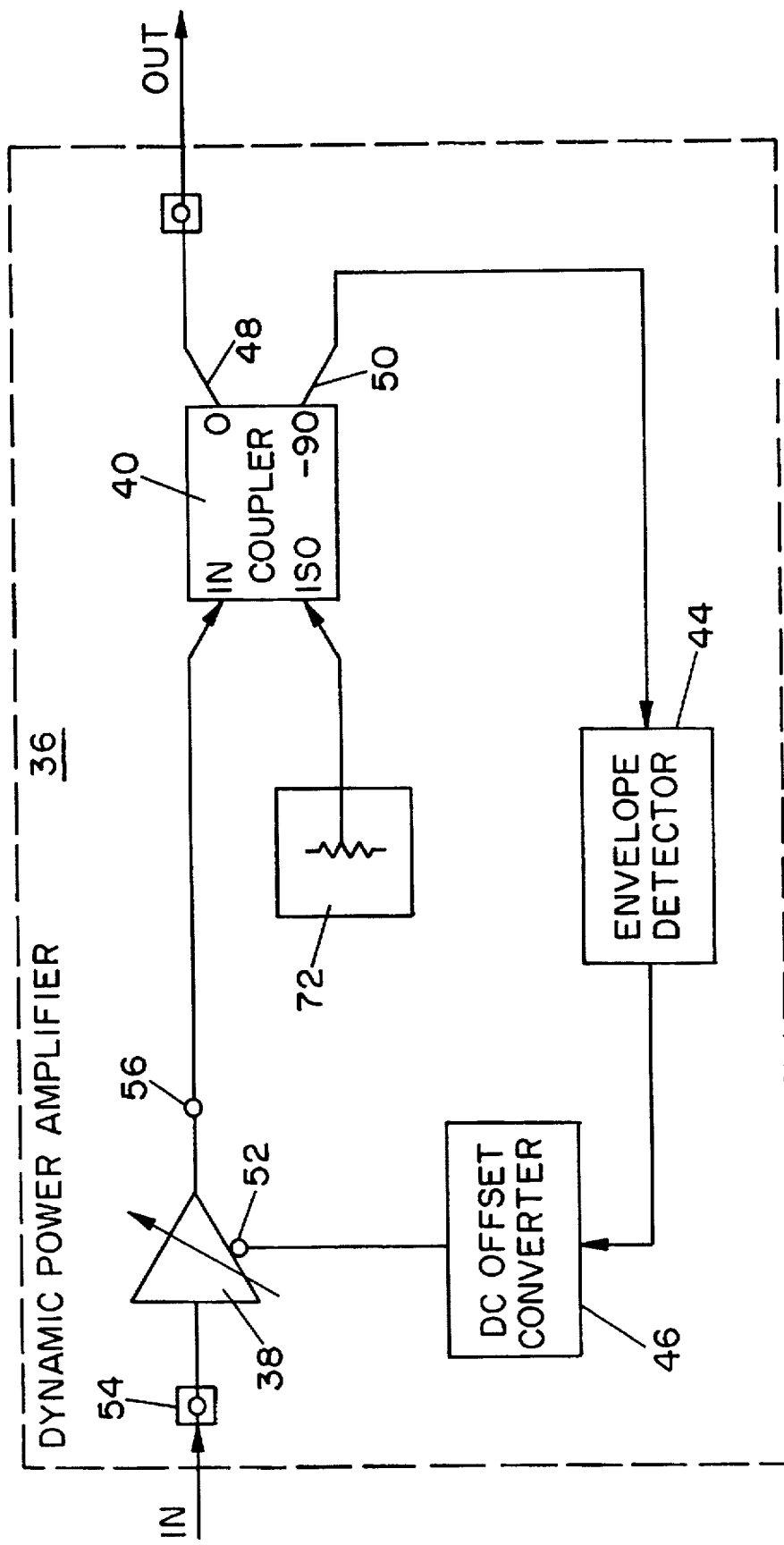
FIG. 2 illustrates a block diagram of a dynamic power amplifier in accordance with one embodiment of the invention.

FIG. 2 illustrates a block diagram of a dynamic power amplifier, such as 36, in accordance with one embodiment of the present invention, although the invention is not limited in scope in that respect. The input terminal of dynamic power amplifier 36 receives a voltage signal from the output terminal of driver 34 (FIG. 1 ). This voltage signal is coupled to an input terminal of a power amplifier 38. Advantageously, as it will be explained in more detail with reference to FIGS. 3a and 3b, power amplifier 38 comprise a bipolar junction transistor (BJT), or a field effect transistor (FET), although the invention is not limited in scope in that respect.

The output voltage signal of power amplifier 38 is coupled to an input terminal of a power sensing device such as coupler 40. One example of coupler 40 may be a directional coupler such as the one manufactured by Mini-Circuits™, Brooklyn, N.Y. The basic function of a directional coupler is to receive an input signal and to provide two output signals that correspond to the input signal. The output signals are not equal in amplitude. The large power output signal is at the main-line output port 48, and, the smaller power indication signal is at the coupled port 50. Typically, there is high isolation between the coupled port and the output port. Thus, with the use of directional coupler 40, it is possible to monitor and sense the power signal level at the output terminal of power amplifier 38 independent of load conditions at the output of dynamic power amplifier 36.

The power indication signal at coupled port 50 is applied to an input terminal of an envelope detector 44. Typically, envelope detector 44 is a capacitor-diode network that measures approximately the average value of the power indication signal provided by coupler 40. The output signal of envelope detector 44 is substantially a direct current (DC) average voltage signal, which corresponds to the output power level of power amplifier 38. The operation of envelope detector 44 is well-known and described in Micro-Electronics, Digital and Analog Circuits and Systems, by Jacob Millman ( McGraw-Hill 1979).

The output terminal of the envelope detector is coupled to an input terminal of a direct current (DC) offset converter 46. DC offset converter 46 generates a substantially direct current (DC) biasing voltage signal that corresponds to the magnitude of the average output voltage signal provided by envelope detector 44. The direct current (DC) biasing voltage signal of converter 46 is coupled to an input terminal 52 of power amplifier 38, as it will be explained in more detail hereinafter, with reference to FIGS. 3a and 3b.

Figure 3A:
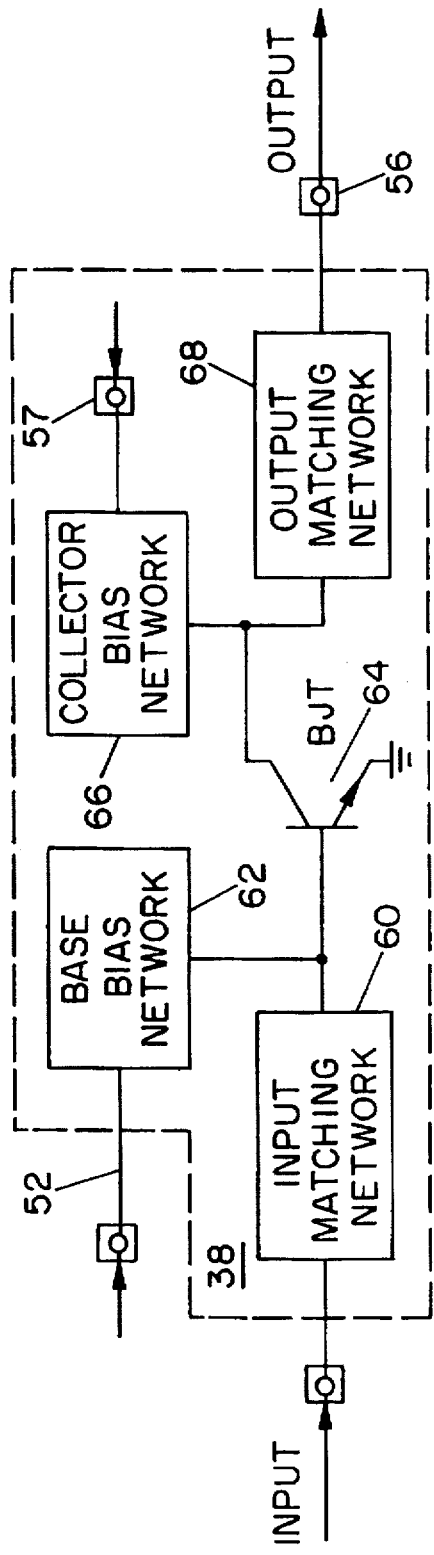
FIG. 3a illustrates a block diagram of a power amplifier employed in a dynamic power amplifier in accordance with an embodiment of the invention.

FIG. 3a illustrates a block diagram of a power amplifier 38 in accordance with one embodiment of the present invention, although the invention is not limited in scope in that respect. Voltage signal coupled to terminal 54 is in turn applied to an input terminal of an input matching network 60. Typically, input matching network 60 comprises a resistance, a capacitance and an inductance and provides impedance matching between the output stage of driver 34 (FIG. 1), and the input stage of amplifier 38. The output terminal of input matching network 60 is coupled to the base terminal of a transistor 64. Transistor 64 is preferably a power BJT transistor that is configured to operate at high frequencies.

The base terminal of transistor 64 is also configured to receive a direct current voltage signal from a base bias network 62. Base bias network 62 receives a substantially direct current (DC) biasing voltage signal from converter 46 via terminal 52. Base bias network 62 is preferably a low pass filter that is configured to prevent high frequency signals from traveling to or from transistor 64 via the base bias network.

The emitter terminal of transistor 64 is coupled to the ground signal level. The collector terminal of transistor 64 is coupled to a collector bias network 66. Collector bias network 66 receives a substantially constant direct current (DC) voltage signal from a constant DC voltage source, such as a battery, via terminal 57, and provides a biasing current to transistor 64. Preferably, the collector bias network may be configured as a low pass filter to prevent high frequency signals from traveling to or from transistor 64 via the collector bias network.

The collector terminal of transistor 64 is also coupled to an input terminal of an output matching network 68, which is configured to provide impedance-matching between the output stage of power amplifier 38 and input stage of duplexer 14 (FIG. 1).

Figure 3B:
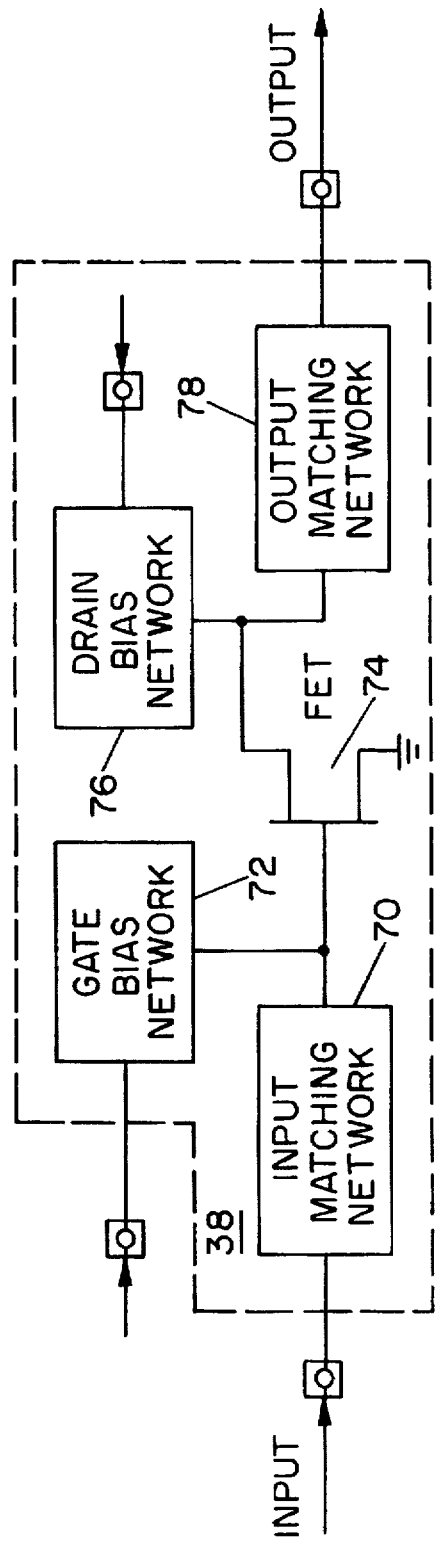
FIG. 3b illustrates a block diagram of a power amplifier employed in a dynamic power amplifier in accordance with another embodiment of the invention.

FIG. 3b illustrates a block diagram of power amplifier 38 employing a field effect transistor (FET) 74, instead of a bipolar junction transistor BJT 64 of FIG. 3a. It will be appreciated by those skilled in the art that the operation of power amplifier 38, in conjunction with transistor 74, is based on the same principles discussed in reference to FIG. 3a. Thus, the operation of dynamic power amplifier 36 is applicable to both embodiments illustrated in FIGS. 3a and 3b, although the invention is not limited in scope in that respect.

During operation, dynamic power amplifier 36 adjusts the biasing voltage signals of power amplifier 38 based on the power signal level at the output terminal of power amplifier 38. Coupler 40 monitors the power signal level and provides a corresponding power indication voltage signal at terminal 50. Since power amplifier 38 amplifies high frequency signals, envelope detector 44 is preferably employed to provide an average voltage signal which corresponds to the average power signal level at the output of power amplifier 38. Based on this average power signal level, converter 46 provides a corresponding biasing signal to terminal 52 of base bias network 62. The change in biasing signal changes the operating point of transistor 64 such that the transistor maintains a substantially linear characteristics. Preferably, the converter provides a biasing voltage signal that allows transistor 64 to operate at a substantially high efficiency for a wide range of power signal levels.

The efficiency of transistor 64 depends, among other things, on the input power signal level provided at its input terminal. For a transistor that is biased at a fixed biasing point, the efficiency of the transistor decreases as the input power signal level decreases. The efficiency of the transistor may be represented by $$\eta = \frac{P_{Output} - P_{input}}{V_{CE} I_C} \times 100\%$$

where $\eta$ is known as power-added efficiency, $P_{output}$ is the output power signal level, $P_{input}$ is the input power signal level, $V_{CE}$ is collector voltage signal and $I_C$ is the collector current. For a transistor with a fixed biasing point, the collector voltage signal and the collector current remain constant regardless of variations in the input and output power signal levels. Thus, power added efficiency decreases as the power levels of input and output signals decrease.

However, in accordance with the present invention, the collector voltage signal and the collector current signal vary as the output power signal detected by envelope detector 44 varies. Thus, when the output power signal level decreases, offset DC converter 46 applies a lower voltage signal to base bias network 62. In response, the collector current of transistor 64 also decreases and the power added efficiency of the transistor remains substantially constant.

Typically, it is desirable to operate power transistors 64 or 74 at a predetermined power gain such that the power added efficiency is at a substantially high value, while the transistor remains at a substantial linear region of its operation. Advantageously, such a power gain is defined as 1-dB gain compression point, $G_{1dB}$, which is defined as the power gain where the nonlinearities of the transistor reduces the power gain by 1 dB over the small-signal liner power gain. That is, $$G_{1dB} = G_o(dB) - 1$$

where $G_o(dB)$ is the small-signal linear power gain in decibels.

Figure 4:
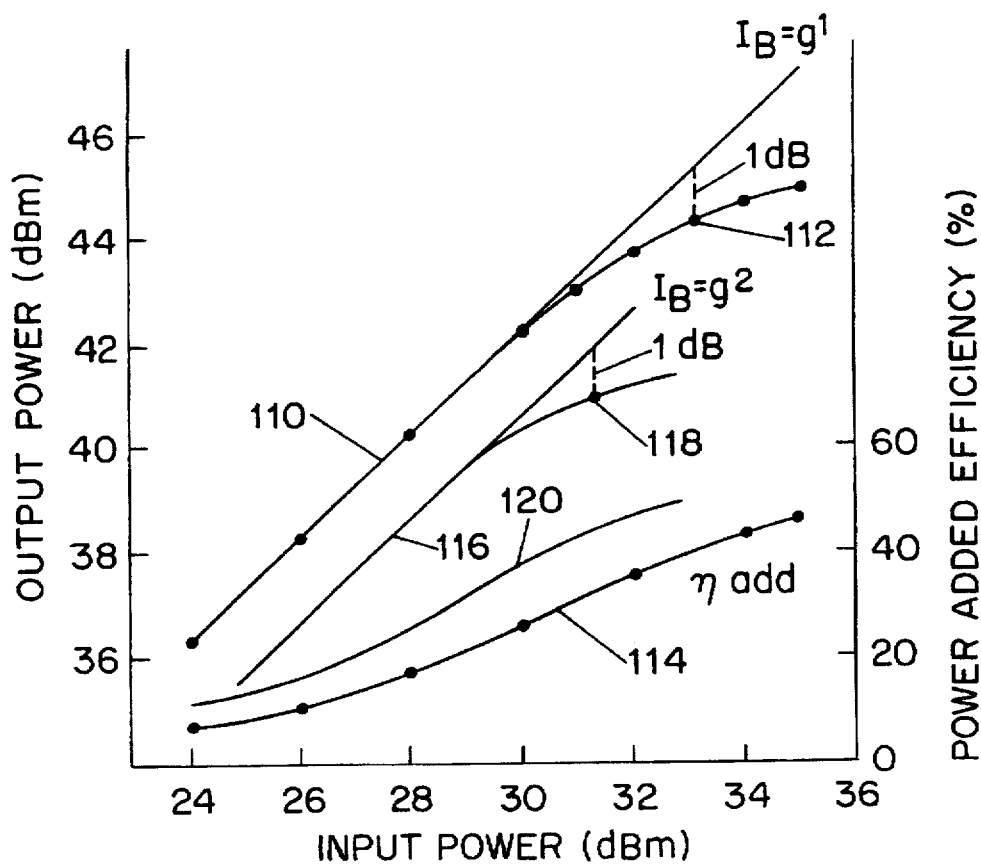
FIG. 4 illustrates a plot of power response characteristics of a transistor employed in a dynamic power amplifier in accordance with an embodiment of the invention.

A typical plot 110 of $P_{output}$ versus $P_{input}$, which illustrates the 1-dB gain compression point 112, is shown in FIG. 4. Plot 110 illustrates a power response characteristic for a typical transistor at 4.7 GHz, at a predetermined base current signal, $I_B = g_1$. The power response characteristic of the transistor may be different depending on the value of base current signal, $I_B$. For example, plot 116 illustrates the power response characteristics of the transistor for a different base current signal $I_B = g_2$.

The power added efficiency of the transistor, at base current signal $I_B = g_1$, is illustrated by plot 114. Again, the power added efficiency of the transistor may be different depending on the value of base current signal, $I_B$. For example, the power added efficiency of the transistor, at base current signal $I_B = g_2$ is illustrated by plot 120.

FIG. 4 illustrates that for the same value of base current signal, the power added efficiency decreases as output power and input power signal levels decrease. However, it is possible to maintain the same power added efficiency by varying the value of the base signal current $I_B$. In accordance with one aspect of the invention, converter 46 may be configured such that for a given output power signal, it applies a direct current voltage signal to base bias network 62 in accordance with power response characteristics illustrated in FIG. 4. To this end, it may be possible to maintain the power gain of the transistor at 1-db gain compression point for a wide range of power output signals generated by amplifier 38.

It will be appreciated that the same principle of operation discussed above in connection with transistor 64 is equally applicable to a power amplifier that employs a field effect transistor (FET) 74. However, instead of varying the base current of transistor 64, it is desirable to vary the gate voltage for transistor 74.

Furthermore, in accordance with another embodiment of the invention, dynamic power amplifier 36 may be configured such that coupler 40 monitors the input power signal level instead of the output power signal level illustrated in FIG. 2. As such, the detected input power signal level may be coupled to an input terminal of envelop detector 44, which in turn causes converter 46 to vary the biasing signals of the transistor employed in power amplifier 38.

Thus, the present invention allows high frequency power amplifiers such as those employed in battery driven wireless terminals or other battery driven devices, to operate linearly at substantially high power added efficiency for a wide range of input and output power signal levels. Advantageously, this results in an extended battery life and more reliable device.

The foregoing merely illustrates the principles of the inventions. It will thus be appreciated that those skilled in the art will be able to devise various arrangements which, although not explicitly described or shown herein, embody the principles of the invention and are thus within its spirit and scope.

We claim:

1. An electronic system having a dynamic power amplifier comprising:
   input amplifier adapted to receive an input signal having a given power signal level adapted to provide an amplifier output signal having a given power output signal level;
   a power sensor configured to receive said power output signal and to generate a power indication signal corresponding to said power output signal;
   a converter adapted to receive said power indication signal in order to generate a biasing signal corresponding to said power indication signal, said biasing signal applied to said input amplifier so that the operating bias point of said power amplifier varies as a function of said power indication signal such that the power added efficiency of said power amplifier remains substantially constant.

2. The invention in accordance with claim 1 further comprising an envelope detector coupled to said power sensor so as to receive said power indication signal and generate a substantially direct current (DC) average voltage signal corresponding to the average value of said power indication signal, said average voltage signal applied to said converter to control the magnitude of said biasing signal.

3. The invention in accordance with claim 2, wherein said input amplifier further comprises a bipolar junction transistor having a base terminal coupled to a base bias network circuit, said base terminal adapted to receive said biasing signal via said base bias network circuit.

4. The invention in accordance with claim 3 wherein said power sensor comprises an inductive coupler having one input terminal for receiving output signal generated by said power amplifier and further having two output terminals adapted to generate a main output signal and said power indication signal.

5. The invention in accordance with claim 4, wherein said envelope detector further comprises a capacitance-diode network.

6. The invention in accordance with claim 4, wherein said converter generates said biasing signals such that said input amplifier operates at a substantially linear region of its operation.

7. The invention in accordance with claim 6, wherein said converter is further adapted to generate said biasing signals such that said input amplifier operates at its 1-dB compression point gain for a substantially wide range of output power signals monitored by said coupler.

8. The invention in accordance with claim 7, wherein said dynamic power amplifier is employed in an output stage of a wireless terminal.

9. The invention in accordance with claim 1, wherein said electronic system is a wireless terminal configured to transfer and receive signals from a base terminal.

10. A method for dynamically controlling a power amplifier employed in a wireless terminal used for transmitting to a base terminal, said method comprising the steps of:

generating a given power output signal in response to an input signal applied to said power amplifier, said power output signal having a given power signal corresponding to the distance of said wireless terminal to said base terminal;

generating a power indication signal corresponding to said power output signal;

generating a biasing signal corresponding to said power indication signal so as to vary the biasing point of said power amplifier as a function of said power indication signal such that the power added efficiency of said amplifier remains substantially constant.

11. The invention in accordance with claim 10, further comprising the step of generating a substantially direct current (DC) average voltage signal corresponding to the average value of said power indication signal.

* * * * *